United States Patent
Karalkar et al.

(10) Patent No.: US 12,543,331 B2
(45) Date of Patent: Feb. 3, 2026

(54) ELECTROSTATIC DISCHARGE PROTECTION DEVICES FOR BI-DIRECTIONAL CURRENT PROTECTION

(71) Applicant: GlobalFoundries U.S. Inc., Malta, NY (US)

(72) Inventors: Sagar Premnath Karalkar, Sagus, MA (US); Kyong Jin Hwang, Singapore (SG); Joseph James Jerry, Singapore (SG)

(73) Assignee: GlobalFoundries U.S. Inc., Malta, NY (US)

( * ) Notice: Subject to any disclaimer, the term of this patent is extended or adjusted under 35 U.S.C. 154(b) by 383 days.

(21) Appl. No.: 18/307,772

(22) Filed: Apr. 26, 2023

(65) Prior Publication Data

US 2024/0363740 A1   Oct. 31, 2024

(51) Int. Cl.
*H10D 10/60* (2025.01)
*H10D 10/01* (2025.01)
*H10D 62/10* (2025.01)

(52) U.S. Cl.
CPC .......... *H10D 10/60* (2025.01); *H10D 10/061* (2025.01); *H10D 62/124* (2025.01)

(58) Field of Classification Search
CPC ..... H10D 10/60; H10D 10/061; H10D 62/124
See application file for complete search history.

(56) References Cited

U.S. PATENT DOCUMENTS

| | | | |
|---|---|---|---|
| 7,875,933 B2 | 1/2011 | Schneider et al. | |
| 9,991,369 B2* | 6/2018 | Noh | H10D 62/115 |
| 10,224,411 B2 | 3/2019 | Mallikarjunaswamy et al. | |
| 2007/0007545 A1* | 1/2007 | Salcedo | H10D 8/80 |
| | | | 257/127 |
| 2013/0049112 A1 | 2/2013 | Lai et al. | |
| 2014/0339601 A1* | 11/2014 | Salcedo | H10D 89/713 |
| | | | 257/140 |
| 2018/0082994 A1 | 3/2018 | Han et al. | |
| 2022/0376119 A1 | 11/2022 | Yoo et al. | |

OTHER PUBLICATIONS

Vaschenko, Concannon, ter Beek and Hopper, "Multi-port ESD protection using bi-directional SCR structures," 2003 Proceedings of the Bipolar/BiCMOS Circuits and Technology Meeting (IEEE Cat. No. 03CH37440), Toulouse, France, 2003, pp. 137-140, doi: 10.1109/BIPOL.2003.1274953.

\* cited by examiner

*Primary Examiner* — Jonathan Han
(74) *Attorney, Agent, or Firm* — Francois Pagette (57) ABSTRACT

An electrostatic discharge (ESD) protection device is provided. The ESD protection device includes a substrate having an upper substrate surface, an active well region, a first terminal well region, and a second terminal well region. The active well region is in the substrate, and the first terminal well region and the second terminal well region are in the active well region. The second terminal well region is spaced apart from the first terminal well region. The first terminal well region and the second terminal well region each includes a first doped region, a first contact region having at least a portion in the first doped region, and a second contact region spaced apart from the first doped region.

19 Claims, 4 Drawing Sheets

ELECTROSTATIC DISCHARGE PROTECTION DEVICES FOR BI-DIRECTIONAL CURRENT PROTECTION

TECHNICAL FIELD

The present disclosure relates generally to electrostatic discharge (ESD) protection devices, and more particularly to ESD protection devices for bi-directional current protection and methods of forming the same.

BACKGROUND

Electrostatic discharges (ESD) constitute a permanent threat to electrical systems. An ESD event may involve a power surge, i.e., an excessively high voltage generated during a relatively short period of time. The power surge typically exceeds the breakdown voltage of an electrical system and may lead to an excessively high current through the electrical system, causing irreparable damage.

Protection against such electrostatic discharges or ESD events may be necessary. For example, an electrical system may be coupled to an ESD protection device, and the ESD protection device may be capable of conducting excessively high electrical current away from the electrical system during an ESD event, thereby protecting the electrical system from electrical damage.

In order to effectively protect the electrical system from an ESD event, the ESD protection device is preferably capable of providing bi-directional current protection, i.e., capable of providing protection to positive and negative power surges. However, such an ESD protection device tends to have a large footprint and a high on-resistance.

Therefore, solutions are provided to overcome, or at least ameliorate, the disadvantages described above.

SUMMARY

To achieve the foregoing and other aspects of the present disclosure, electrostatic discharge (ESD) protection devices for bi-directional current protection and methods of forming the same are presented.

According to an aspect of the present disclosure, an electrostatic discharge (ESD) protection device is provided. The ESD protection device includes a substrate having an upper substrate surface, an active well region, a first terminal well region, and a second terminal well region. The active well region is in the substrate, and the first terminal well region and the second terminal well region are in the active well region. The second terminal well region is spaced apart from the first terminal well region. The first terminal well region and the second terminal well region each includes a first doped region, a first contact region having at least a portion in the first doped region, and a second contact region spaced apart from the first doped region.

According to another aspect of the present disclosure, an ESD protection device is provided. The ESD protection device includes a substrate having an upper substrate surface, an active well region, a first terminal well region, and a second terminal well region. The active well region is in the substrate, and the first terminal well region and the second terminal well region are in the active well region. The second terminal well region is spaced apart from the first terminal well region. The first terminal well region and the second terminal well region each includes a first doped region, a second doped region, a third doped region, a first contact region, and a second contact region. The second doped region and the third doped region include dopants having an opposite dopant conductivity from the first doped region. The first contact region has at least a portion in the first doped region and the second contact is in the second doped region. The first contact region and the second contact region also include dopants having an opposite dopant conductivity.

According to yet another aspect of the present disclosure, a method of forming an ESD protection device is provided. The method includes forming an active well region in a substrate and forming a first terminal well region and a second terminal well region spaced apart from the first terminal well region in the active well region. A first doped region is formed in each of the first terminal well region and the second terminal well region. A first contact region is formed in each of the first terminal well region and the second terminal well region, and the first contact region has at least a portion in the first doped region. A second contact region is formed in each of the first terminal well region and the second terminal well region, and the second contact region is spaced apart from the first doped region.

BRIEF DESCRIPTION OF THE DRAWINGS

The embodiments of the present disclosure will be better understood from a reading of the following detailed description, taken in conjunction with the accompanying drawings.

For simplicity and clarity of illustration, the drawings illustrate the general manner of construction, and certain descriptions and details of features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to electrostatic discharge (ESD) protection devices for providing bi-directional current protection and methods of forming the same are presented. An ESD protection device may be coupled to an electrical system to conduct excessively high current arising from an ESD event to, for example, the ground, thereby preserving the functionality of the electrical system.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

Figure 1:
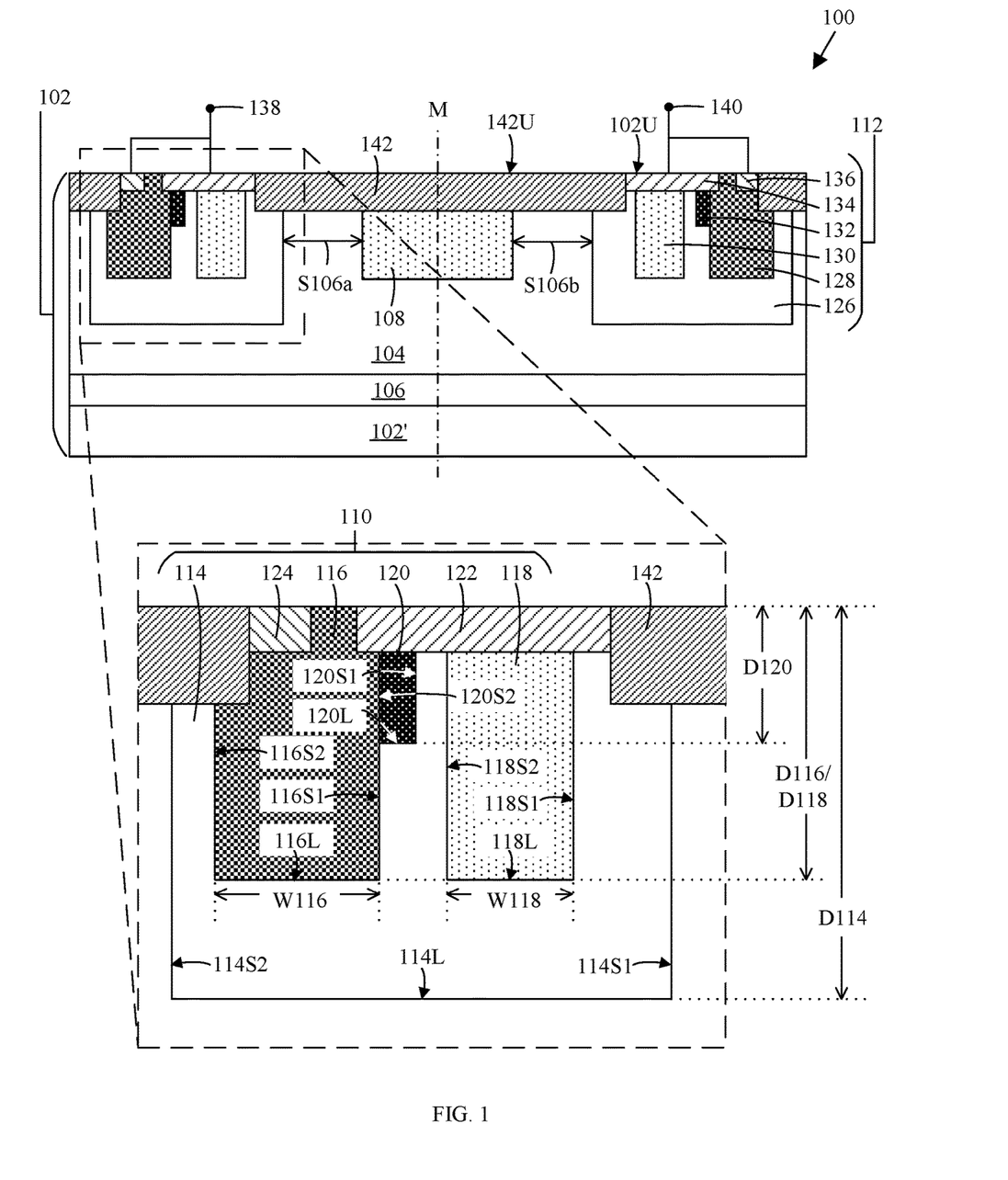
FIG. 1 is a cross-sectional view of an ESD protection device, according to an embodiment of the disclosure.

FIG. 1 is a cross-sectional view of an ESD protection device 100, according to an embodiment of the disclosure. The ESD protection device 100 may be suitable for providing bi-directional current protection to an electrical system. The ESD protection device 100 may include a lateral bipolar junction transistor (BJT) device having a symmetrical reverse breakdown voltage for positive and negative voltages. Hereinafter, the ESD protection device 100 will be described with reference to a "PNP" BJT device. Alternatively, an "NPN" BJT device may be applicable to serve as an ESD protection device by reversing polarities of dopant conductivities as disclosed herein. The designation of "n" and "p" is based on the type of dopant present and its conductivity. For example, n-type conductivity may be provided by n-type dopants that contribute free electrons to the substrate, such as arsenic, phosphorus, or antimony, and p-type conductivity may be provided by p-type dopants that create deficiencies of valence electrons, such as boron, aluminum, or gallium.

The ESD protection device 100 may include a substrate 102 having an upper substrate surface 102U. The substrate 102 may include a semiconductor material, such as silicon, silicon germanium, silicon carbide, other II-VI or III-V semiconductor compounds, and the like. The substrate 102 may be a bulk semiconductor substrate or a composite semiconductor substrate, such as a semiconductor-on-insulator (SOI) substrate. The substrate 102 may include a base layer 102'. In an embodiment of the disclosure, the base layer 102' of the substrate 102 may include p-type dopants.

The substrate 102 may include an active well region 104 over the base layer 102'. The active well region 104 may extend downwardly from the upper substrate surface 102U. The active well region 104 may define a boundary within which the ESD protection device 100 operates. The active well region 104 may include dopants having a different dopant conductivity from the base layer 102' of the substrate 102, for example, n-type dopants. In this example, the active well region 104 may also be referred to as a high-voltage deep n-well region. The active well region 104 may include a higher concentration of dopants than the base layer 102' of the substrate 102. In an embodiment of the disclosure, the active well region 104 may have a dopant concentration of about $5E15$ $cm^{-3}$ to about $5E16$ $cm^{-3}$.

A doped layer 106 may be optionally arranged under the active well region 104. The doped layer 106 may separate the active well region 104 from the base layer 102' of the substrate 102. The doped layer 106 may include dopants having the same dopant conductivity as the active well region 104, for example, n-type dopants. The doped layer 106 may further include a higher dopant concentration than the active well region 104 and the base layer 102' of the substrate 102. The dopants in the doped layer 106 and the dopants in the active well region 104 may or may not include the same dopants.

An n-type well region 108, a first terminal region 110, and a second terminal region 112 may be arranged in the active well region 104. The first terminal region 110 and the second terminal region 112 may be arranged proximate to the ends of the active well region 104, and the well region 108 may be arranged between the first terminal region 110 and the second terminal region 112. The first terminal region 110 may be spaced apart from the well region 108 by a portion of the active well region 104 having a lateral spacing S106a. As used herein, the term "lateral" refers to a direction substantially parallel to a plane of the upper substrate surface 102U. The term "vertical" refers to a direction substantially perpendicular to the plane of the upper substrate surface 102U.

Similar to the first terminal region 110, the second terminal region 112 may be spaced apart from the well region 108 by another portion of the active well region 104 having a lateral spacing S106b. As illustrated in FIG. 1, the lateral spacing S106a may be substantially equal to the lateral spacing S106b. The lateral spacings S106a, S106b may be adjusted, or optimized, based on the voltage application designed for the ESD protection device 100. In an embodiment of the disclosure, each lateral spacing S106a, S106b may range from at least 100 nanometers (nm).

Even though the well region 108 may include dopants having the same dopant conductivity as the active well region 104, the well region 108 may or may not include the same dopants as the active well region 104. The well region 108 may serve to increase the reliability of the ESD protection device 100 by minimizing early punch through and current leakage through the ESD protection device 100. The well region 108 may have a higher dopant concentration than the active well region 104. In an embodiment of the disclosure, the well region 108 may have a dopant concentration of about $1E17$ $cm^{-3}$ to about $5E18$ $cm^{-3}$.

The first terminal region 110 may further include a p-type terminal well region 114, a p-type doped region 116, an n-type doped region 118, a p-type doped drift region 120, a p-type contact region 122, and an n-type contact region 124. The terminal well region 114, the doped region 116, the doped region 118, the drift region 120, the contact region 122, and the contact region 124 may extend downwardly from the upper substrate surface 102U.

The terminal well region 114 may include a lower surface 114L, a side surface 114S1, and a side surface 114S2 laterally opposite the side surface 114S1. The terminal well region 114 may further have a depth D114 extending from the upper substrate surface 102U to the lower surface 114L. In an embodiment of the disclosure, the terminal well region 114 may provide a deeper junction depth than the other doped regions in the first terminal region 110 for more effective current conduction through the ESD protection device 100. The terminal well region 114 may also have a higher dopant concentration than the active well region 104. In an embodiment of the disclosure, the terminal well region 114 may include a dopant concentration of about $1E16$ $cm^{-3}$ to about $1E17$ $cm^{-3}$.

The doped region 116 may be arranged in the terminal well region 114. The doped region 116 may include a lower surface 116L, a side surface 116S1, and a side surface 116S2 laterally opposite the side surface 116S1. The doped region 116 may provide a shallower junction depth than the terminal well region 114. For example, the doped region 116 may have a depth D116 extending from the upper substrate surface 102U to the lower surface 116L, and the depth D116 may be shallower than the depth D114 of the terminal well region 114.

The side surface 116S2 of the doped region 116 may be spaced apart from the side surface 114S2 of the terminal well region 114. Alternatively, the side surface 116S2 of the doped region 116 may be substantially vertically aligned with the side surface 114S2 of the terminal well region 114, i.e., the side surface 116S2 of the doped region 116 may be substantially coplanar with the side surface 114S2 of the terminal well region 114, even though this embodiment is not illustrated in the accompanying drawings. The doped region 116 may also have a higher dopant concentration than the terminal well region 114. In an embodiment of the disclosure, the doped region 116 may include a dopant concentration of about 1E17 cm$^{-3}$ to about 5E18 cm$^{-3}$.

The doped region 118 may be arranged laterally adjacent to the doped region 116 in the terminal well region 114. The doped region 118 may be arranged closer to the well region 108 than the doped region 116. The doped region 118 may include a lower surface 118L, a side surface 118S1, and a side surface 118S2 laterally opposite the side surface 118S1. The doped region 118 may be spaced apart from the doped region 116. For example, a portion of the terminal well region 114 may be arranged laterally between the doped region 118 and the doped region 116 such that the side surface 118S2 of the doped region 118 and the side surface 116S1 of the doped region 116 may not share a common vertical plane.

Additionally, the doped region 118 may be spaced apart from the side surface 114S1 of the active well region 104 by a portion of the terminal well region 114 such that the side surface 118S1 of the doped region 118 and the side surface 114S1 of the terminal well region 114 do not share a common vertical plane. The doped region 118 may have a similar dopant concentration as the doped region 116. In an embodiment of the disclosure, the doped region 118 may include a dopant concentration of about 1E17 cm$^{-3}$ to about 5E18 cm$^{-3}$.

The doped region 118 may have a depth D118 extending from the upper substrate surface 102U to the lower surface 118L. The depth D118 may be at least as deep as the depth D116 of the doped region 116. For example, as illustrated in FIG. 1, the depth D118 may be substantially as deep as the depth D116 of the doped region 116 such that the lower surface 118L of the doped region 118 may be substantially coplanar with the lower surface 116L of the doped region 116. In another example, the depth D118 may be deeper than the depth D116, even though this embodiment is not illustrated in the accompanying drawings. Additionally, the depth D118 may be shallower than the depth D114 of the terminal well region 114 such that the lower surface 118L of the doped region 118 may be over and spaced apart from the lower surface 114L of the terminal well region 114.

The doped region 118 may have a width W118 and the doped region 116 may have a width W116, and the width W118 may be wider than the width W116. As used herein, the term "width" refers to a measurement of a feature from two laterally opposing side surfaces, for example, from the side surface 118S1 to the side surface 118S2 of the doped region 118 or from the side surface 116S1 to the side surface 116S2 of the doped region 116. In an embodiment of the disclosure, the width W118 of the doped region 118 may be at least half the width W116 of the doped region 116.

The drift region 120 may be arranged between the doped region 116 and the doped region 118 in the terminal well region 114. The drift region 120 may include a lower surface 120L, a side surface 120S1, and a side surface 120S2 laterally opposite the side surface 120S1. The drift region 120 may be partially in contact with the doped region 116 such that the side surface 120S2 of the drift region 120 and the side surface 116S1 of the doped region 116 may share a common vertical plane in the terminal well region 114. The side surface 120S1 of the drift region 120 may be spaced apart from the side surface 116S1 of the doped region 116.

Additionally, the drift region 120 may be spaced apart from the doped region 118 by a portion of the terminal well region 114. The drift region 120 may also have a dopant concentration higher than the dopant concentration of the doped region 116 or the doped region 118. In an embodiment of the disclosure, the drift region 120 may include a dopant concentration of about 5E16 cm$^{-3}$ to about 5E17 cm$^{-3}$.

The drift region 120 may have a depth D120 extending from the upper substrate surface 102U to the lower surface 120L. The depth D120 may be shallower than the depth D116 of the doped region 116 or the depth D118 of the doped region 118 such that the lower surface 120L of the drift region 120 may be above the lower surface 116L of the doped region 116 or the lower surface 118L of the doped region 118. Additionally, the depth D120 may be shallower than the depth D114 of the terminal well region 114 such that the lower surface 120L of the drift region 120 may be over and spaced apart from the lower surface 114L of the terminal well region 114. In an embodiment of the disclosure, the depth D116 of the doped region 116 and the depth D118 of the doped region 118 may extend to a similar depth within the active well region 104 as the well region 108.

The contact region 122 and the contact region 124 may be arranged in the terminal well region 114 and spaced apart from each other. The contact region 122 may have a depth extending from the upper substrate surface 102U to the lower surface, and the depth may be shallower than the other doped regions in the first terminal region 110 or the second terminal region 112. Similarly, the contact region 124 may have a depth extending from the upper substrate surface 102U to the lower surface, and the depth may be shallower than the other doped regions in the first terminal region 110 or the second terminal region 112. In an embodiment of the disclosure, the depth of the contact region 122 may be substantially similar to the depth of the contact region 124.

The contact region 122 may include a first end and a second end opposite the first end. The first end of the contact region 122 may be in contact with the terminal well region 114 and the second end of the contact region 122 may be in contact with the doped region 116. The second end of the contact region 122 may be proximate to the contact region 124 with respect to the first end. The contact region 122 may further include at least a portion in the doped region 118. The contact region 124 may be arranged in the doped region 116 and may be spaced apart from the contact region 122 by a portion of the doped region 116.

The contact region 122 and the contact region 124 may have a higher dopant concentration than the terminal well region 114, the doped region 116, the doped region 118, and the drift region 120. In an embodiment of the disclosure, the dopant concentration of the contact region 122 may be substantially similar to the dopant concentration of the contact region 124. In another embodiment of the disclosure, the contact region 122 may include a dopant concentration of about 1E19 cm$^{-3}$ to about 5E20 cm$^{-3}$.

The contact region 122 and the contact region 124 may serve as contact terminals of the first terminal region 110 of the ESD protection device 100, such that the ESD protection device 100 may be at least electrically coupled to an electrical system through the contact region 122 and the contact region 124.

The second terminal region 112 may be a mirror image of the first terminal region 110, i.e., the second terminal region 112 may have mirror symmetry of the first terminal region 110 about an axis M through the center of the ESD protection device 100. For example, the second terminal region 112 may include a p-type terminal well region 126, a p-type doped region 128, an n-type doped region 130, a p-type drift region 132, a p-type contact region 134, and an n-type contact region 136.

The terminal well region 126 may be synonymous with the terminal well region 114, the doped region 128 may be synonymous with the doped region 116, the doped region 130 may be synonymous with the doped region 118, the drift region 132 may be synonymous with the drift region 120, the contact region 134 may be synonymous with the contact region 122, and the contact region 136 may be synonymous with the contact region 124. The terminal well region 126, the doped region 128, the doped region 130, the drift region 132, the contact region 134, and the contact region 136 may be arranged in a similar arrangement configuration and may have similar dopant concentrations as the terminal well region 114, the doped region 116, the doped region 118, the drift region 120, the contact region 122, and the contact region 124 of the first terminal region 110.

The first terminal region 110 may be electrically coupled to a first terminal point 138 through the contact region 122 and the contact region 124. Similarly, the second terminal region 112 may be electrically coupled to a second terminal point 140 through the contact region 134 and the contact region 136. The first terminal point 138 and the second terminal point 140 may be electrically coupled to respective connectors (not shown) of an electrical system (not shown), so that during an ESD event, the excessive current generated may be shunted through the ESD protection device 100 instead of flowing to the electrical system.

The ESD protection device 100 may yet further include an insulating structure 142. The insulating structure 142 may extend downwardly from the upper substrate surface 102U and terminate therewithin. The insulating structure 142 may have an upper surface 142U, and the upper surface 142U may be substantially coplanar with the upper substrate surface 102U, as illustrated in FIG. 1. Alternatively, the upper surface 142U of the insulating structure 142 may be over the upper substrate surface 102U, even though this embodiment is not shown in FIG. 1. In an embodiment of the disclosure, the insulating structure 142 may be a dielectric isolation structure, such as a shallow trench isolation (STI) structure. The insulating structure 142 may include a dielectric material, for example, silicon oxide.

The insulating structure 142 may be partially over the active well region 104. For example, a portion of the insulating structure 142 may be arranged over the well region 108 and have end portions extending into the first terminal region 110 and the second terminal region 112. As illustrated in FIG. 1, the portion of the insulating structure 142 may be continuous and in contact with the contact region 122 and the contact region 134. Another portion of the insulating structure 142 may be at least partially in the first terminal region 110, and this portion of the insulating structure 142 may be in contact with the contact region 124. Similarly, yet another portion of the insulating structure 142 may be arranged at least partially in the second terminal region 112, and this portion of the insulating structure 142 may be in contact with the contact region 136.

The ESD protection device 100 may provide a lower on-resistance with the inclusion of the doped region 118 in the first terminal region 110 and the doped region 130 in the second terminal region 112. When an ESD event occurs, the voltage across the ESD protection device 100 will exceed the triggering voltage of the ESD protection device 100 and the current will flow through the ESD protection device 100 to conduct excess current away from the external system. For example, during the ESD event, a PNP junction formed between the p-type terminal well region 114, the collective n-type active well region 104, the n-type well region 108, and the p-type terminal well region 126.

A lateral NPN junction and a vertical NPN junction may also be formed in each of the first terminal region 110 and the second terminal region 112. The lateral NPN junction may be formed between the n-type doped region 118, the collective p-typed doped region 116 and the drift region 120, and the n-type contact region 124, while the vertical NPN junction may be formed by the n-type doped region 118, the p-type terminal well region 114, and the active well region 104. Due to the presence of the NPN junctions, the ESD protection device 100 may also be able to support a higher current and operate at a lower temperature as the NPN junctions may increase the current carrying capacity of the ESD protection device 100. Accordingly, the ESD protection device 100 may advantageously occupy a smaller footprint due to the improved electrical performance resulting from the differently doped regions in the first terminal region 110 and the second terminal region 112.

Figure 2:
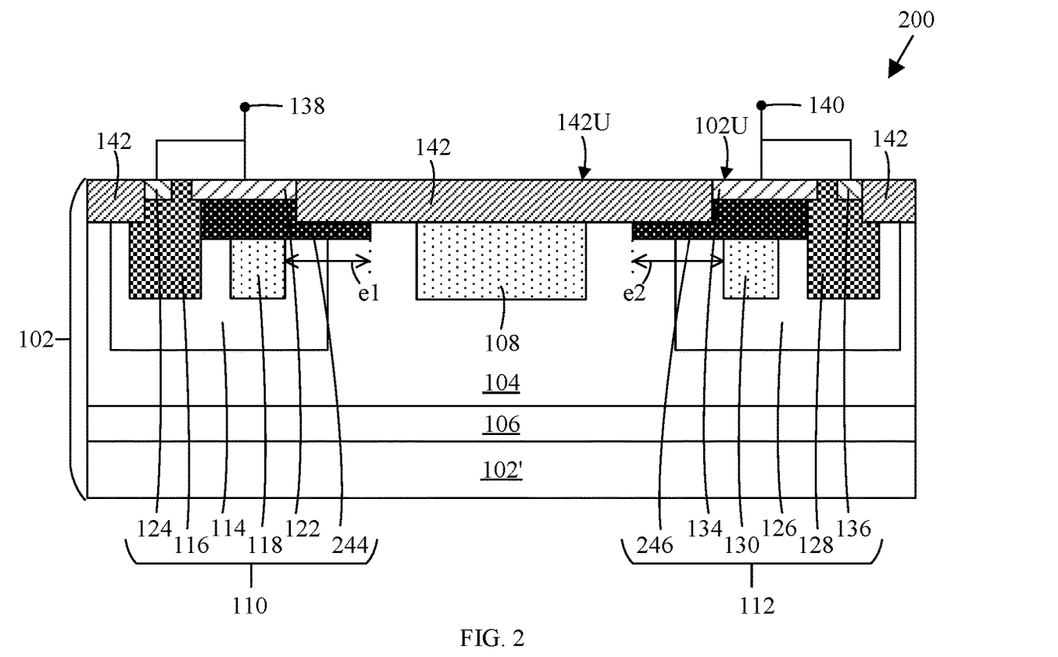
FIG. 2 is a cross-sectional view of an ESD protection device, according to another embodiment of the disclosure.

FIG. 2 is a cross-sectional view of an ESD protection device 200, according to another embodiment of the disclosure. The ESD protection device 200 may be similar to the ESD protection device 100 in FIG. 1, and thus common features are labeled with the same reference numerals and need not be discussed.

Similar to the ESD protection device 100, the ESD protection device 200 may also include a first terminal region 110 and a second terminal region 112. The first terminal region 110 may include a drift region 244 that may be synonymous with the drift region 120 of the ESD protection device 100 in FIG. 1. However, unlike the drift region 120, the drift region 244 may extend laterally towards the well region 108 such that the doped region 118 may be under the drift region 244. In an embodiment of the disclosure, the drift region 244 may extend beyond the side surface 118S1 of the doped region 118 by an extension e1 into the active well region 104, as illustrated. In another embodiment of the disclosure, the drift region 244 may extend beyond the side surface 118S1 of the doped region 118 but terminate within the terminal well region 114, even though this embodiment is not illustrated in the accompanying drawings. The extension e1 may be adjusted, or optimized, based on the voltage application designed for the ESD protection device 200. The extension e1 may range from about 100 nm to about 1000 nm.

Similarly, the second terminal region 112 may include a drift region 246 that may be synonymous with the drift region 132 of the ESD protection device 100 in FIG. 1. However, unlike the drift region 132, the drift region 246 may extend laterally towards the well region 108 such that the doped region 130 may be under the drift region 246. The drift region 246 may extend beyond the doped region 130 by an extension e2. The extension e2 may terminate in the active well region 104 or the terminal well region 126. In an embodiment of the disclosure, the extension e2 may extend to a substantially similar extent as the extension e1.

Figure 3:
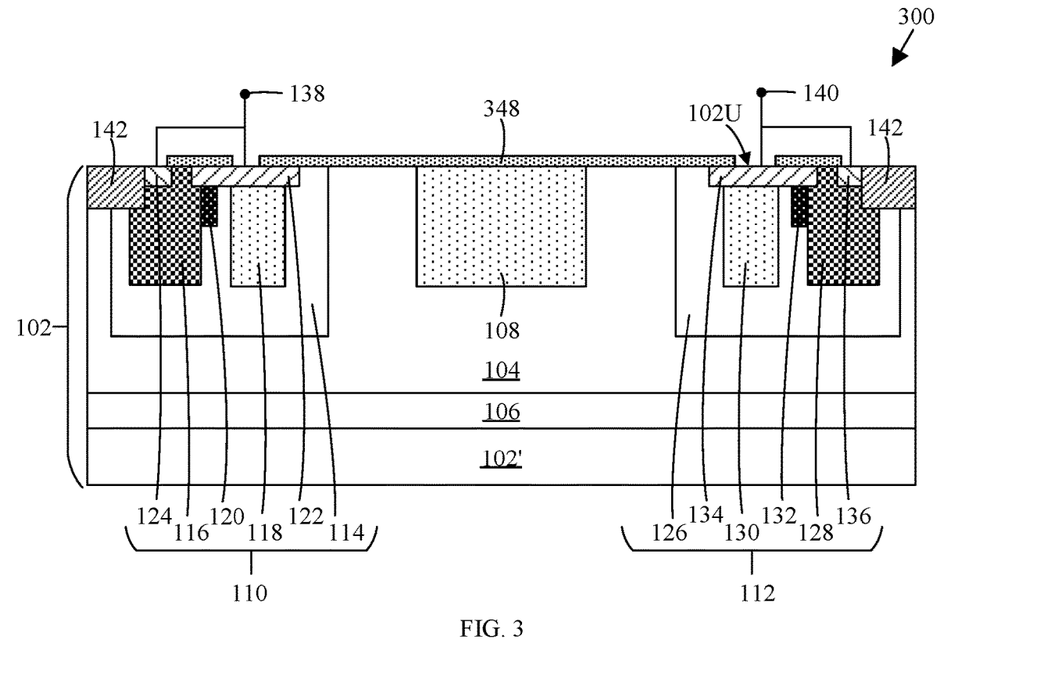
FIG. 3 is a cross-sectional view of an ESD protection device, according to yet another embodiment of the disclosure.

FIG. 3 is a cross-sectional view of an ESD protection device 300, according to yet another embodiment of the disclosure. The ESD protection device 300 may be similar to the ESD protection device 100 in FIG. 1, and thus common features are labeled with the same reference numerals and need not be discussed.

Similar to the ESD protection device 100, the ESD protection device 300 may include an insulating layer 348. The insulating layer 348 may provide similar properties and/or functions as the insulating structure 142 of the ESD protection device 100 in FIG. 1. However, unlike the insulating structure 142, the insulating layer 348 may be arranged over the substrate 102. For example, the insulating layer 348 may overlay and may be in direct physical contact with the upper substrate surface 102U. In an embodiment of the disclosure, the insulating layer 348 may be a dielectric isolation layer, such as a silicide alignment block (SAB) layer. The insulating layer 348 may include a dielectric material, for example, silicon nitride.

Even though the ESD protection device 300 illustrates the drift region 120 as being spaced apart from the doped region 118 by a portion of the terminal well region 114, the drift region 120 may be adjusted, or optimized, based on the voltage application designed for the ESD protection device 300. For example, the drift region 120 may extend laterally towards the well region 108 such that the doped region 118 may be under the drift region 244, similar to the embodiments disclosed above and illustrated in FIG. 2.

There are several advantages to using either an STI layer or a SAB layer as the insulating layer for an ESD protection device. For example, an STI layer may be preferred for a relatively high voltage application as the STI layer may provide a higher device breakdown voltage while compromising on the current dopant conductivity as compared to a SAB layer. In another example, a SAB layer may be preferred for a relatively lower voltage application as the SAB layer may provide a relatively higher current dopant conductivity while providing a lower device breakdown voltage than an STI layer. Thus, there may be a tradeoff between the device breakdown voltage and the current dopant conductivity.

Figure 4:
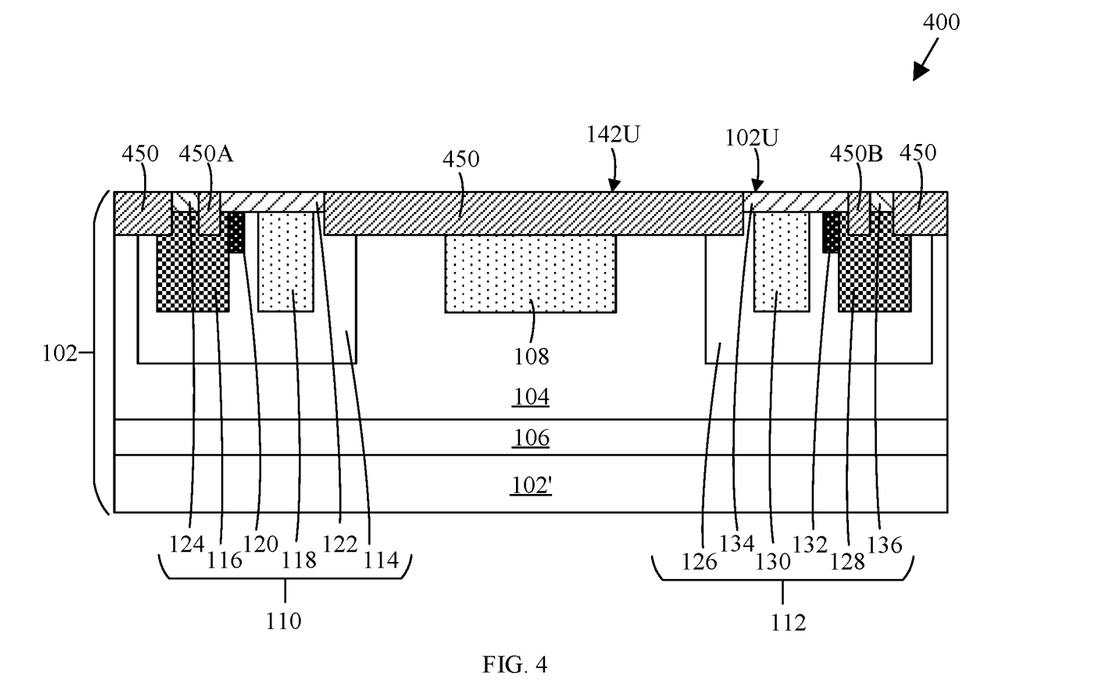
FIG. 4 is a cross-sectional view of an ESD protection device, according to a further embodiment of the disclosure.

FIG. 4 is a cross-sectional view of an ESD protection device 400, according to a further embodiment of the disclosure. The ESD protection device 400 may be similar to the ESD protection device 100 in FIG. 1, and thus common features are labeled with the same reference numerals and need not be discussed.

Similar to the ESD protection device 100, the ESD protection device 400 may also include an insulating structure 450. The insulating structure 450 may be predominantly similar to the insulating structure 142 of the ESD protection device 100 in FIG. 1. The insulating structure 450 may include an additional portion 450A in the substrate 102 between the contact region 122 and the contact region 124 in the first terminal region 110. The portion of the insulating structure 450A may be in direct contact with the contact region 122 and the contact region 124 so as to provide direct insulation, at least electrically, between the contact region 122 and the contact region 124.

The insulating structure 450 may further include another additional portion 450B in the substrate 102 between the contact region 134 and the contact region 136 in the second terminal region 112. The portion of the insulating structure 450B may be in direct contact with the contact region 134 and the contact region 136 so as to provide direct insulation, at least electrically, between the contact region 134 and the contact region 136.

The insulating structure 450 may be a discontinuous layer having discrete portions in the substrate 102 or a continuous layer having openings to expose portions of the contact regions 122, 124, 134, 136 for electrical connectivity purposes. In an embodiment of the disclosure, the insulating structure 450 may be an STI layer.

Even though the ESD protection device 400 illustrates the drift region 120 as being spaced apart from the doped region 118 by a portion of the terminal well region 114, the drift region 120 may be adjusted, or optimized, based on the voltage application designed for the ESD protection device 300. For example, the drift region 120 may extend laterally towards the well region 108 such that the doped region 118 may be under the drift region 244, similar to the embodiments disclosed above and illustrated in FIG. 2.

Figure 5:
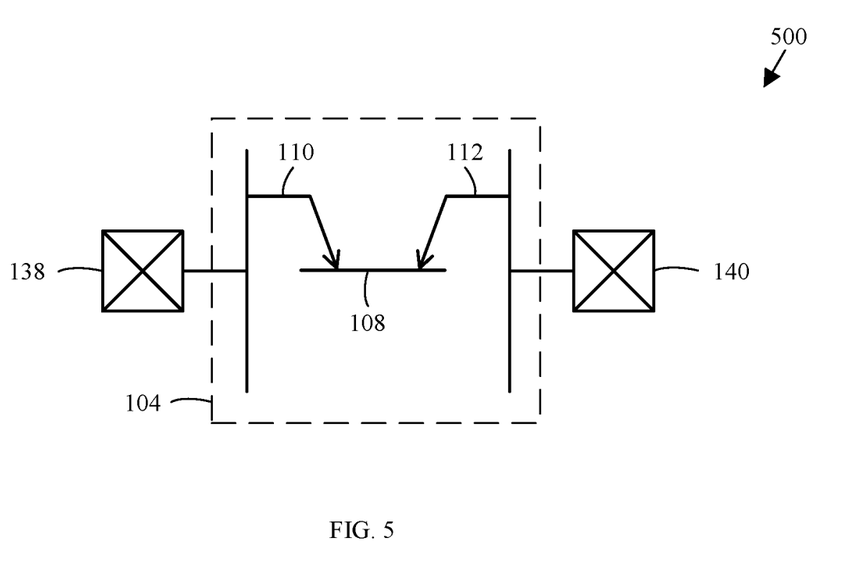
FIG. 5 is a circuit diagram of the ESD protection device in FIG. 1, according to an embodiment of the disclosure.

FIG. 5 illustrates an equivalent circuit diagram 500 of the ESD protection device 100, according to an embodiment of the disclosure. The ESD protection device 100 may similarly operate like a lateral BJT device. For example, each terminal point 138, 140 may serve as an emitter region or a collector region, depending on the voltage levels received at the first terminal region 110 and the second terminal region 112. Where the first terminal region 110 is biased at a higher voltage than the second terminal region 112, the first terminal region 110 may serve as a collector region while the second terminal region 112 may serve as an emitter region. Alternatively, where the first terminal region 110 is biased at a lower voltage than the second terminal region 112, the first terminal region 110 may serve as an emitter region while the second terminal region 112 may serve as a collector region.

Figure 6:
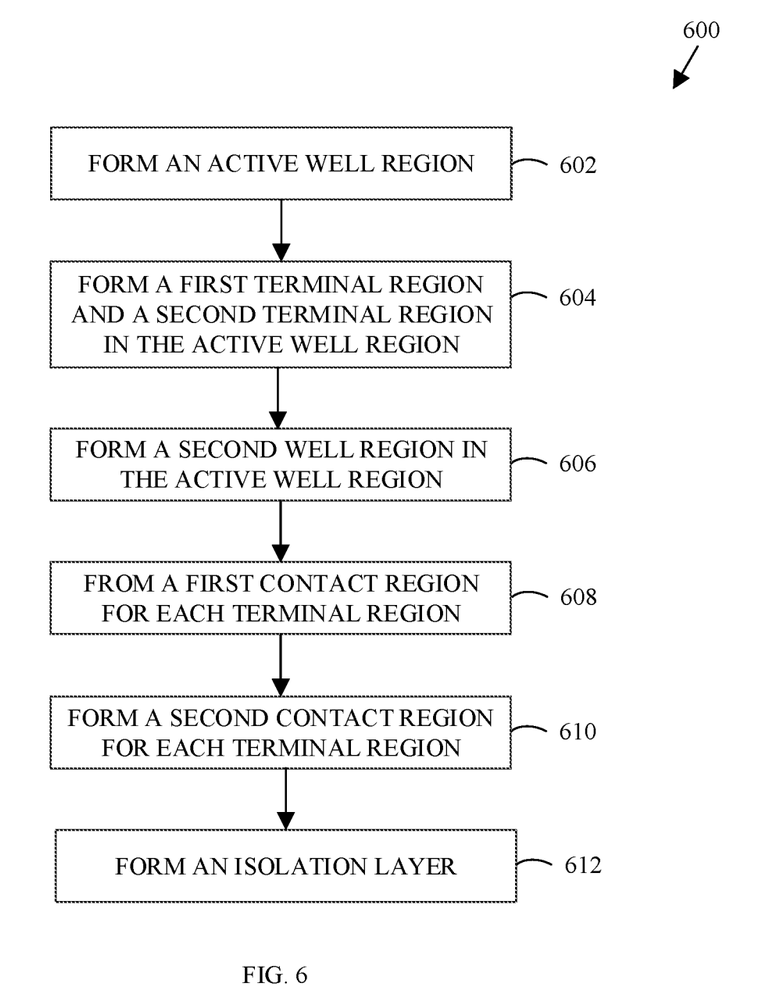
FIG. 6 is a flow chart illustrating a method of forming the ESD protection device in FIG. 1, according to an embodiment of the disclosure.

FIG. 6 is a flow chart 600 illustrating a method of forming an ESD protection device, according to an embodiment of the disclosure. The ESD protection device may be similar to the ESD protection device 100 of FIG. 1. Certain structures may be fabricated, for example, using known processes and techniques, and specifically disclosed processes and methods may be used to achieve individual aspects of the present disclosure. The below-described order for the method of forming the ESD protection device is intended to be illustrative, and the method is not limited to the specifically described order unless otherwise specifically stated.

As used herein, "deposition techniques" refer to the process of applying a material over another material. Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" include deposition of material or photoresist, patterning, exposure, development, etching, cleaning, and/or removal of the material or photoresist as required in forming a described pattern, structure, or opening. Exemplary examples of techniques for patterning include, but not limited to, wet etch photolithographic processes, dry etch photolithographic processes, or direct patterning processes.

A substrate may be provided. The substrate may be synonymous with the substrate 102 of the ESD protection device 100 of FIG. 1. An active well region may be formed in or over the substrate, as illustrated by operation 602 in the flow chart 600. The active well region may be synonymous with the active well region 104 of the ESD protection device 100 in FIG. 1. The active well region may be formed by introducing dopants into the substrate using a doping technique, such as an ion implantation process. Alternatively, the active well region may be formed by growing an epitaxial layer over the substrate using an epitaxy process and introducing the dopants into the epitaxial layer using an in-situ doping technique. The dopants in the active well region may provide a different dopant conductivity from the substrate. The active well region may be electrically isolated from adjacent conductive features by an isolation feature (not shown in the accompanying drawings).

Optionally, a doped layer having a higher dopant concentration than the active well region may be formed under the active well region and the doped layer may separate the active well region from the substrate. The doped layer may be formed using a doping technique or an epitaxy process. The doped layer may include the same dopants as the first well region, though not necessarily so.

A first terminal region and a second terminal region may be formed in the active well region, as illustrated by operation 604. The first terminal region and the second terminal region may be synonymous with the first terminal region 110 and the second terminal region 112 in FIG. 1, respectively. The first terminal region and the second terminal region may be spaced apart from each other and may have mirror symmetry about the center of the ESD protection device, for example, about an axis M as illustrated in FIG. 1.

An exemplary method of forming the first terminal region is described herein. A terminal well region may be formed in the active well region. The terminal well region may be synonymous with the terminal well region 114 of the ESD protection device 100 in FIG. 1. The terminal well region may be formed by introducing dopants into the active well region using a doping technique, such as an ion implantation process. In an embodiment of the disclosure, the terminal well region may include dopants having a different dopant conductivity than the active well region, for example, p-type dopants. The terminal well region may also have a higher dopant concentration than the active well region.

A first doped region and a drift region may be consecutively or concurrently formed in the terminal well region. The first doped region and the drift region may be synonymous with the doped region 116 and the drift region 120 of the ESD protection device 100 in FIG. 1. The first doped region and the drift region may be formed by introducing dopants into the terminal well region using a doping technique, such as an ion implantation process. In an embodiment of the disclosure, the first doped region and the drift region may include dopants having the same dopant conductivity; the dopants in the second doped region may or may not include the same dopants as the first doped region. The second doped region may also have a lower dopant concentration than the first doped region.

A second doped region may be formed in the terminal well region and adjacent to the drift region. The second doped region may be synonymous with the drift region 120 of the ESD protection device 100 in FIG. 1. The second doped region may be formed by introducing dopants into the terminal well region using a doping technique, such as an ion implantation process. The ion implantation process may include counter doping the terminal well region with dopants having a different dopant conductivity. In an embodiment of the disclosure, the second doped region may include dopants having a different dopant conductivity from the first doped region and the drift region, for example, n-type dopants. The dopants in the second doped region may or may not include the same dopants as the active well region. The second doped region may also have a higher dopant concentration than the active well region.

Similar process steps may be employed to form the second terminal region. The second terminal region may be formed concurrently with the first terminal region, according to an embodiment of the disclosure. In another embodiment of the disclosure, the second terminal region may be formed separately from the first terminal region.

A second well region may be formed in the active well region and between the first terminal region and the second terminal region, as illustrated by operation 606. The second well region may be synonymous with the well region 108 of the ESD protection device 100 in FIG. 1. The second well region may be formed by introducing dopants into the first well region using a doping technique, such as an ion implantation process. In an embodiment of the disclosure, the second well region may include dopants having the same dopant conductivity as the first well region; the dopants in the second well region may or may not include the same dopants as the first well region. The second well region may also have a higher dopant concentration than the first well region.

A first contact region may be formed for each terminal region, as illustrated by operation 608. The first contact region may be synonymous with the contact region 122 of the first terminal region 110 and the contact region 134 of the second terminal region 112 of the ESD protection device 100 of FIG. 1. The first contact region in each terminal region may be formed by introducing dopants into the respective first and second doped regions using a doping technique, such as an ion implantation process. In an embodiment of the disclosure, the first contact region in each terminal region may include dopants having the same dopant conductivity as the first doped region and the second doped region of each terminal region; the dopants in the fourth doped region may or may not include the same dopants as the first doped region and the second doped region.

A second contact region may be subsequently formed for each terminal region, as illustrated by operation 610. The second contact region may be synonymous with the contact region 124 of the first terminal region 110 and the contact region 136 of the second terminal region 112 of the ESD protection device 100 of FIG. 1. The second contact region in each terminal region may be formed by introducing dopants into the respective first and second doped regions using a doping technique, such as an ion implantation process. In an embodiment of the disclosure, the second contact region in each terminal region may include dopants having a different dopant conductivity as the first doped region and the second doped region of each terminal region; the dopants in the second contact region may or may not include the same dopants as the first doped region and the second doped region.

An insulating layer may be formed at least partially over the first well region, as illustrated by operation 612. In an embodiment of the disclosure, the insulating layer may be synonymous with the insulating structure 142 of the ESD protection device 100 in FIG. 1. An exemplary method of forming the insulating layer may be described herein. A trench may be formed in the first well region using a patterning technique. A dielectric material may be deposited in the trench using a deposition technique.

In another embodiment of the disclosure, the insulating layer may be synonymous with the insulating layer 348 of the ESD protection device 300 in FIG. 3. An exemplary method of forming the insulating layer may be described herein. A layer of dielectric material may be deposited over the first well region using a deposition technique and the layer of dielectric material may be patterned using a patterning technique to form openings such that the contact regions of each terminal region may be exposed therein.

Electrical connections may be formed at the contact regions of each terminal region to electrically couple the ESD protection device to a first terminal point and a second terminal point. The first terminal point and the second terminal point may be electrically coupled to respective connectors of an electrical system to protect the electrical system from damage arising from an ESD event.

As presented in the above disclosure, various embodiments of ESD protection devices and methods of forming the same are presented. The ESD protection devices may be symmetrical to support dual-polarity bias, i.e., the ESD protection devices may provide bi-directional current protection against positive and negative power surges.

The ESD protection device may include two terminal regions to electrically couple the ESD protection device to an electrical system. Each terminal region may include a plurality of "PNP" junctions, and each "PNP" junction may amplify the electrical performance of the ESD protection device. Additionally, an n-type doped region may be arranged in each terminal region to reduce the on-resistance of the ESD protection device by introducing a deeper current path to achieve a snapback behavior. The lower on-resistance advantageously enables the ESD protection device to achieve enhanced current performance which aids to reduce the overall footprint of the device. Alternatively, the polarities of the dopant conductivities may be reversed to form an "NPN" ESD protection device including a plurality of "NPN" junctions.

The terms "upper", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", or "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of ninety degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above-detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. An electrostatic discharge (ESD) protection device, comprising:
   a substrate having an upper substrate surface;
   an active well region in the substrate;
   a first terminal well region in the active well region; and
   a second terminal well region in the active well region spaced apart from the first terminal well region, wherein the first terminal well region and the second terminal well region each comprising:
      a first doped region;
      a second doped region laterally spaced apart from the first doped region, wherein the second doped region has an opposite dopant conductivity from the first doped region;
      a first contact region having at least a portion in the first doped region; and
      a second contact region in the second doped region.

2. The ESD protection device of claim 1, wherein the first contact region and the second contact region comprise dopants having an opposite dopant conductivity.

3. The ESD protection device of claim 2, wherein the second contact region comprises dopants having the same dopant conductivity as the first doped region.

4. The ESD protection device of claim 1, wherein the first contact region has an end portion in the second doped region, and the end portion is spaced apart from the second contact region by a portion of the second doped region.

5. The ESD protection device of claim 1, further comprising a third doped region in the first terminal well region and the second terminal well region, wherein the third doped region has a first end portion in contact with each of the second doped region in the first terminal well region and the second terminal well region, and comprises dopants having an opposite dopant conductivity from the first doped region.

6. The ESD protection device of claim 5, wherein the third doped region is laterally spaced apart from the first doped region by a portion of the first terminal well region.

7. The ESD protection device of claim 5, wherein the first doped region is under the third doped region.

8. The ESD protection device of claim 7, wherein the third doped region further comprises a second end portion and the second end portion is in the active well region.

9. The ESD protection device of claim 5, wherein the first doped region has a first depth extending from the upper substrate surface to a lower surface of the first doped region, the second doped region has a second depth extending from the upper substrate surface to a lower surface of the second doped region, and the third doped region has a third depth extending from the upper substrate surface to a lower surface of the third doped region, wherein the third depth is shallower than the first depth of the first doped region and the second depth of the second doped region.

10. The ESD protection device of claim 1, wherein the first terminal well region and the second terminal well region each further comprises an insulating structure in the second doped region, and the insulating structure is between and in contact with the first contact region and the second contact region.

11. An ESD protection device, comprising:
a substrate having an upper substrate surface;
an active well region in the substrate;
a first terminal well region in the active well region; and
a second terminal well region in the active well region, wherein the first terminal well region and the second terminal well region each comprising:
a first doped region;
a second doped region laterally spaced apart from the first doped region;
a third doped region laterally between the first doped region and the second doped region, wherein the second doped region and the third doped region comprise dopants having an opposite dopant conductivity from the first doped region;
a first contact region having at least a portion in the first doped region; and
a second contact region in the second doped region, wherein the first contact region and the second contact region comprise dopants having an opposite dopant conductivity.

12. The ESD protection device of claim 11, wherein the first contact region has a dopant concentration substantially similar to a dopant concentration of the second contact region.

13. The ESD protection device of claim 11, wherein the first doped region has a dopant concentration substantially similar to a dopant concentration of the second doped region.

14. The ESD protection device of claim 13, wherein the third doped region has a dopant concentration lower than the dopant concentration of the first doped region.

15. The ESD protection device of claim 11, further comprising a doped layer under the active well region, the doped layer includes dopants having the same dopant conductivity as the first doped region.

16. The ESD protection device of claim 15, wherein the doped layer has a dopant concentration higher than a dopant concentration of the active well region.

17. A method of forming an electrostatic discharge (ESD) protection device, comprising:
forming an active well region in a substrate;
forming a first terminal well region and a second terminal well region spaced apart from the first terminal well region in the active well region;
forming a first doped region in each of the first terminal well region and the second terminal well region;
forming a second doped region laterally spaced apart from the first doped region in each of the first terminal well region and the second terminal well region, wherein the second doped region has an opposite dopant conductivity from the first doped region;
forming a first contact region in each of the first terminal well region and the second terminal well region, the first contact region has at least a portion in the first doped region; and
forming a second contact region in the second doped region of each of the first terminal well region and the second terminal well region.

18. The method of claim 17, further comprising:
forming a second doped region in the first terminal well region and the second terminal well region; and
forming a third doped region partially in contact with each of the second doped region in the first terminal well region and the second terminal well region, wherein the third doped region includes dopants having the same dopant conductivity as the second doped region.

19. The method of claim 17, further comprising doping the first contact region with dopants having a different dopant conductivity from the second contact region.

* * * * *